(12) United States Patent
Matsuo

(10) Patent No.: US 7,179,702 B2
(45) Date of Patent: Feb. 20, 2007

(54) SEMICONDUCTOR DEVICE INCLUDING METAL INSULATOR SEMICONDUCTOR FIELD EFFECT TRANSISTOR AND METHOD OF MANUFACTURING THE SAME

(75) Inventor: Kouji Matsuo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/232,861

(22) Filed: Sep. 23, 2005

(65) Prior Publication Data

US 2006/0011989 A1    Jan. 19, 2006

Related U.S. Application Data

(62) Division of application No. 10/658,371, filed on Sep. 10, 2003, now Pat. No. 6,967,379.

(30) Foreign Application Priority Data

Nov. 6, 2002    (JP) .............................. 2002-322094

(51) Int. Cl.
*H01L 21/8238* (2006.01)
*H01L 21/336* (2006.01)
*H01L 21/8234* (2006.01)
*H01L 21/20* (2006.01)
*H01L 21/4763* (2006.01)
*H01L 21/461* (2006.01)
*H01L 21/00* (2006.01)
*H01L 29/76* (2006.01)

(52) U.S. Cl. ...................... 438/216; 438/217; 438/218; 438/385; 438/585; 438/197; 438/199; 438/158; 438/712; 438/800; 257/369; 257/407; 257/412; 257/410; 257/288; 257/364; 257/365; 257/374; 257/E21.296; 257/E21.622; 257/E21.632

(58) Field of Classification Search ........ 438/216–218, 438/385, 585, 197, 199, 158, 712, 800; 257/369, 257/407, 412, 410, 288, 364, 365, 374
See application file for complete search history.

(56) References Cited

U.S. PATENT DOCUMENTS 5,316,977 A    5/1994    Kunishima et al.

(Continued)

FOREIGN PATENT DOCUMENTS

| JP | 8-130216 | 5/1996 |
|---|---|---|
| JP | 8-153804 | 6/1996 |
| JP | 2000-252370 | 9/2000 |
| JP | 2000-315789 | 11/2000 |
| JP | 2001-203276 | 7/2001 |

OTHER PUBLICATIONS

Japanese Patent Office Action entitled "Notification of Reasons for Rejection," issued by the Japanese Patent Office on May 10, 2005 in counterpart Application No. 2002-322094 and its English translation.

*Primary Examiner*—Walter Lindsay, Jr.
*Assistant Examiner*—Mohsen Ahmadi
(74) *Attorney, Agent, or Firm*—Finnegan, Henderson, Farabow, Garrett & Dunner, L.L.P.

(57) ABSTRACT

A semiconductor device comprises a semiconductor substrate, an N-channel MISFET and a P-channel MISFET provided on the semiconductor substrate, each of the N- and P-channel MISFETs being isolated by an isolation region and having a gate insulating film, a first gate electrode film provided on the gate insulating film of the N-channel MISFET and composed of a first metal silicide, a second gate electrode film provided on the gate insulating film of the P-channel MISFET and composed of a second metal silicide made of a second metal material different from a first metal material composing the first metal silicide, and a work function of the first gate electrode film being lower than that of the second gate electrode film.

8 Claims, 13 Drawing Sheets

U.S. PATENT DOCUMENTS

| | | |
|---|---|---|
| 6,130,123 A * | 10/2000 | Liang et al. ................ 438/217 |
| 6,261,887 B1 | 7/2001 | Rodder |
| 6,376,888 B1 | 4/2002 | Tsunashima et al. |
| 6,475,908 B1 | 11/2002 | Lin et al. |
| 6,483,151 B2 | 11/2002 | Wakabayashi et al. |
| 6,737,716 B1 | 5/2004 | Matsuo et al. |
| 6,750,519 B2 * | 6/2004 | Lin et al. .................... 257/407 |
| 6,833,596 B2 | 12/2004 | Matsuo |
| 2002/0037615 A1 | 3/2002 | Matsuo |
| 2003/0143825 A1 | 7/2003 | Matsuo et al. |

* cited by examiner

SEMICONDUCTOR DEVICE INCLUDING METAL INSULATOR SEMICONDUCTOR FIELD EFFECT TRANSISTOR AND METHOD OF MANUFACTURING THE SAME

CROSS-REFERENCE TO RELATED APPLICATIONS

This is a division of application Ser. No. 10/658,371, filed Sep. 10, 2003, now U.S. Pat. No. 6,967,379 which is incorporated in its entirety herein by reference. This application is also based upon and claims priority from prior Japanese Patent Application No. 2002-322094, filed Nov. 6, 2002, the entire contents of which are incorporated herein by reference.

BACKGROUND OF THE INVENTION

1. Field of the Invention

The present invention relates to a semiconductor device including insulated gate field effect transistors (hereinafter referred to as MISFET) and a method of manufacturing the same.

2. Description of the Related Art

An integrated circuit having high performance is demanded, and high-speed operation is also demanded for a complementary circuit which is one of basic circuits. For the high-speed operation of the complementary circuit, a method in which a channel length of MISFET being a basic element of the complementary circuit is decreased by a fine device technique has been used. Since the fine device structure involves formation of thin films for a gate insulating film and a gate electrode film of MISFET, correspondence to the high-speed operation is reaching a limit in a material which is conventionally used. Therefore, recently new materials and new element structures and manufacturing methods applying the new material have been developed.

For example, since polysilicon generally used as the material of the gate electrode has high resistivity, metal or metal silicide is used instead of polysilicon. However, these materials have a drawback that the materials are inferior in heat resistance to polysilicon.

On the other hand, there is a damascene gate process in which the gate insulating film and the gate electrode are formed after a high-temperature process is carried out. In the damascene gate process, source and drain regions are formed after an oxide film and a polysilicon film which become a dummy are previously formed in an intended gate region. Then, the films which become the dummy are removed and the gate insulating film and the gate electrode made of metal or metal silicide are buried in the removed region.

In the case that the above-described method is applied to the integrated circuit including the complementary circuit, work functions of the gate electrodes become the same when the same metals are used for the gate electrodes of an N-channel MISFET and a P-channel MISFET, so that it becomes difficult to control each threshold voltage to a proper value on circuit operation. Accordingly, it is necessary to provide the different gate electrode materials for the N-channel MISFET and the P-channel MISFET.

For example, in Japanese Patent No. 3264264 (Jpn. Pat. Appln. KOKAI publication No. 2000-252370), the polysilicon films which become the dummies are formed on a semiconductor substrate and source and drain layers are formed. Then, the dummy films are removed and the gate electrodes having the different materials for the N-channel MISFET and the P-channel MISFET are buried in the removed regions respectively. In the method, each threshold voltage of the N-channel MISFET and the P-channel MISFET is controlled to the proper value on the circuit operation, thereby obtaining the integrated circuit having high performance.

For example, it is assumed that a first gate electrode material is used for the N-channel MISFET and a second gate electrode material is used for the P-channel MISFET. In this case, after the first gate electrode material is formed over a surface of the semiconductor substrate, the first gate electrode material for the intended P-channel MISFET region is removed by etching, leaving the first gate electrode material for the intended N-channel MISFET region. Then, after a surface treatment, a cleaning pretreatment for a next process, and the like are carried out, the second gate electrode material is formed only in the intended P-channel MISFET region.

Therefore, in the process in which the first gate electrode material is removed by the etching, the gate insulating film of the P-channel MISFET is always exposed to etching species such as a gas or chemicals, whereby unwanted chemical reaction occurs at the substrate surface. Further, even in the subsequent cleaning processes, the similar reaction is caused by the chemicals for removing metal contamination and the like.

In today's situation in which the fine device structure of the integrated circuit remarkably proceeds, the gate insulating film is thinned to such an extent that the gate insulating film can be counted by an atomic layer. Accordingly, in the case that the gate insulating film is exposed to the gas or chemicals, even if the etching species is selected so that the etching of the gate insulating film is not generated in a macroscopic level, there occurs a problem that uniformity of the gate insulating film is degraded in a microscopic level.

In the integrated circuit, it is important that electrical insulating properties of the gate insulating film in a manufacturing step are prevented from the degradation in long time use of a product with time to secure the reliability. The above-described non-uniformity would become the large problem because it acts as a factor for providing an adverse effect and variation to the reliability.

BRIEF SUMMARY OF THE INVENTION

According to a first aspect of the present invention, there is provided a semiconductor device comprising:

a semiconductor substrate;

an N-channel MISFET and a P-channel MISFET provided on the semiconductor substrate, each of the N- and P-channel MISFETs being isolated by an isolation region and having a gate insulating film;

a first gate electrode film provided on the gate insulating film of the N-channel MISFET and composed of a first metal silicide;

a second gate electrode film provided on the gate insulating film of the P-channel MISFET and composed of a second metal silicide made of a second metal material different from a first metal material composing the first metal silicide; and a work function of the first gate electrode film being lower than that of the second gate electrode film.

According to a second aspect of the present invention, there is provided a method of manufacturing a semiconductor device, comprising:

forming an isolation region in a semiconductor substrate to provide an N- and a P-channel MISFET regions each surrounded by the isolation region;

forming an insulating film on the semiconductor substrate;

forming a conductive film on the insulating film;

patterning selectively the conductive film to provide a gate region in each of the MISFET regions;

forming source and drain regions in each of the MISFET regions for the patterned conductive film by a self-alignment way;

forming a sidewall insulating film around the patterned conductive film;

removing the conductive film and the insulating film of the gate region to provide a space region surrounded by the sidewall insulating film;

forming a gate insulating film on the N- and P-channel MISFET regions each surrounded by the space region, respectively;

forming a first metal silicide film on the gate insulating film within the space region to provide a first gate electrode film;

forming a metal film different from metal composing the first metal silicide film on the P-channel MISFET region; and heat-treating the semiconductor substrate to form a second gate electrode film formed by a solid phase reaction between the first metal silicide film and the metal film, the second gate electrode film being composed of a second metal silicide made of a second metal material different from a first metal material composing the first metal silicide.

DETAILED DESCRIPTION OF THE EMBODIMENTS

Preferred embodiments of the invention will be described below referring to the accompanying drawings.

Figure 1A:
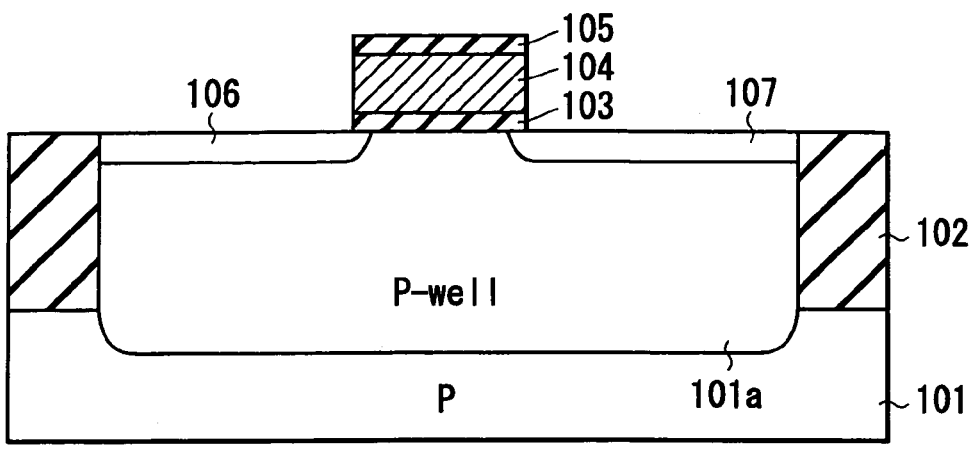
FIGS. 1A to 1J are sectional views showing a series of steps of manufacturing a semiconductor device according to a first embodiment.
Figure 1B:
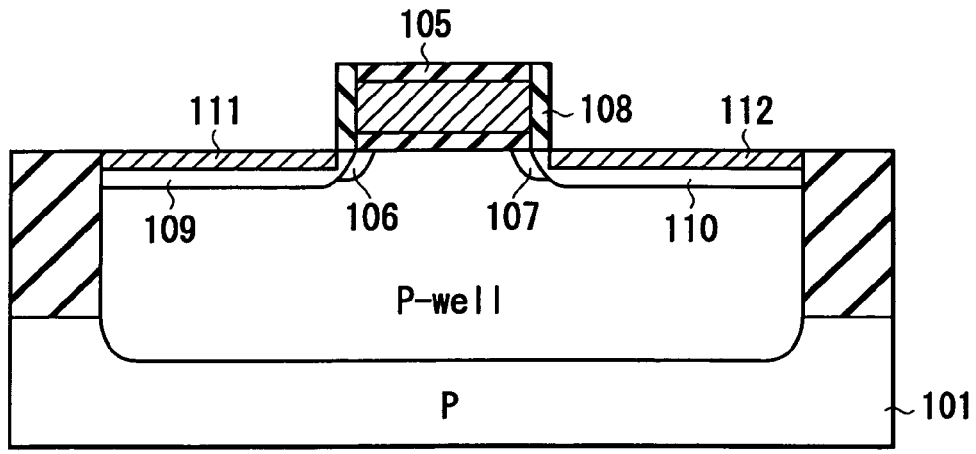
Figure 1C:
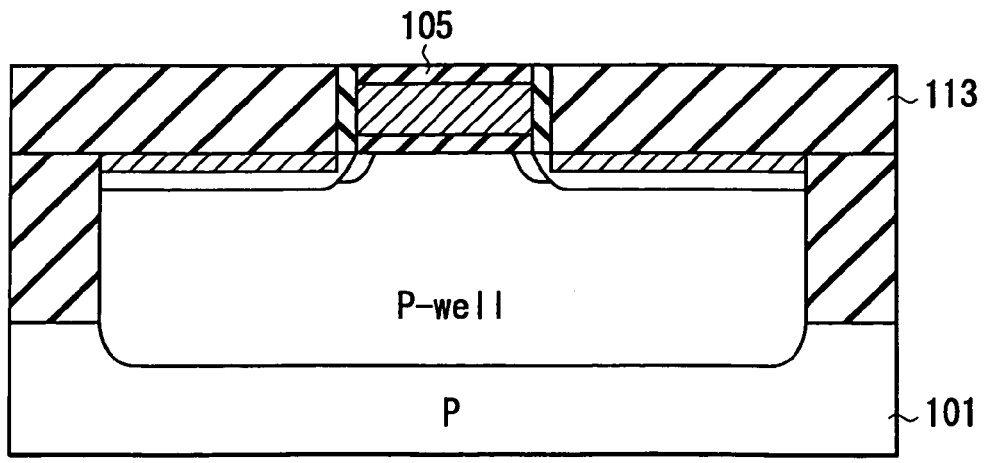
Figure 1D:
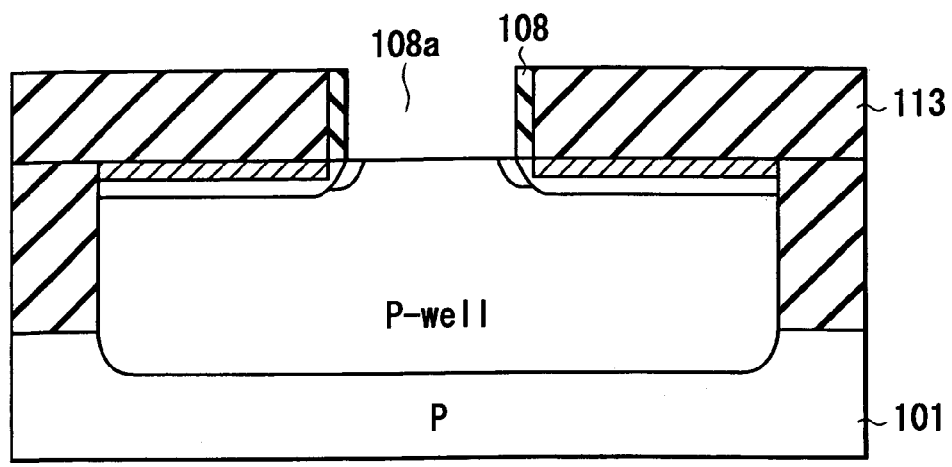
Figure 1E:
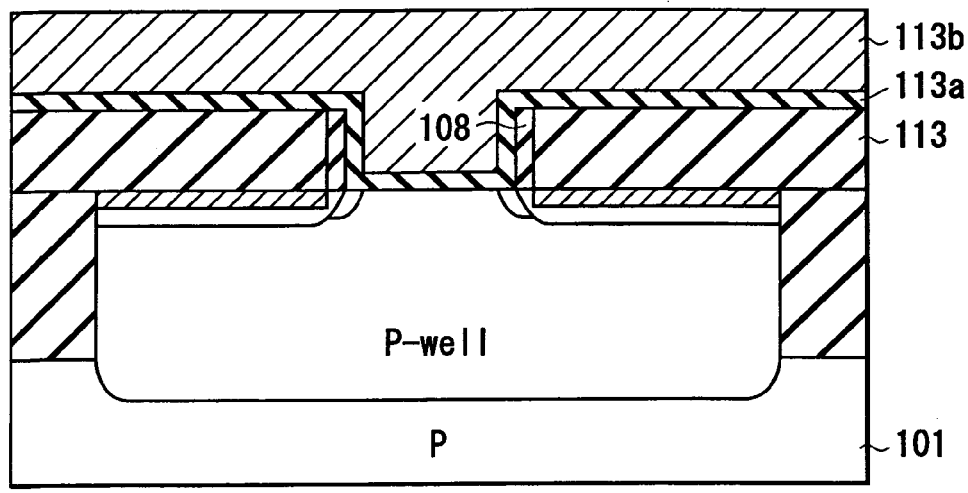
Figure 1F:
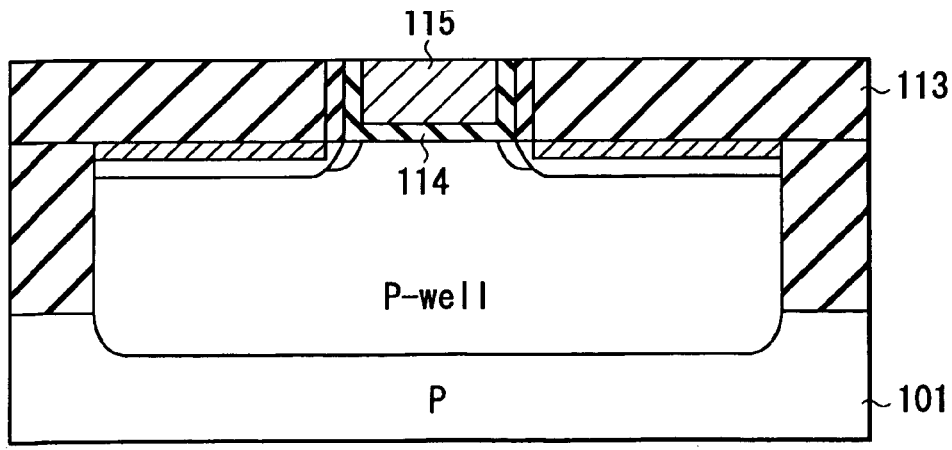
Figure 1G:
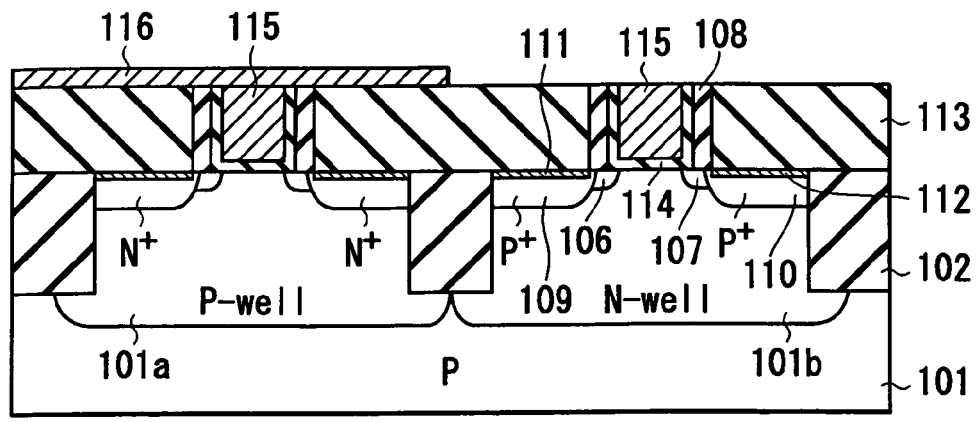
Figure 1H:
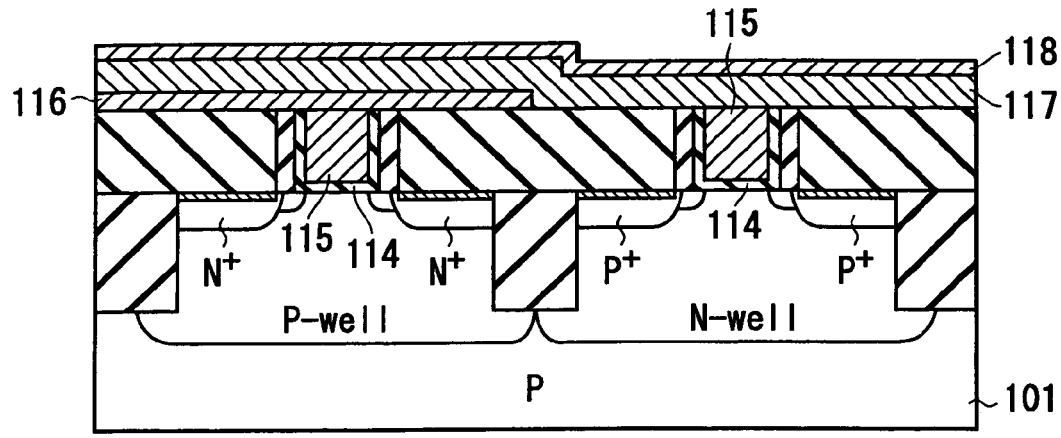
Figure 1I:
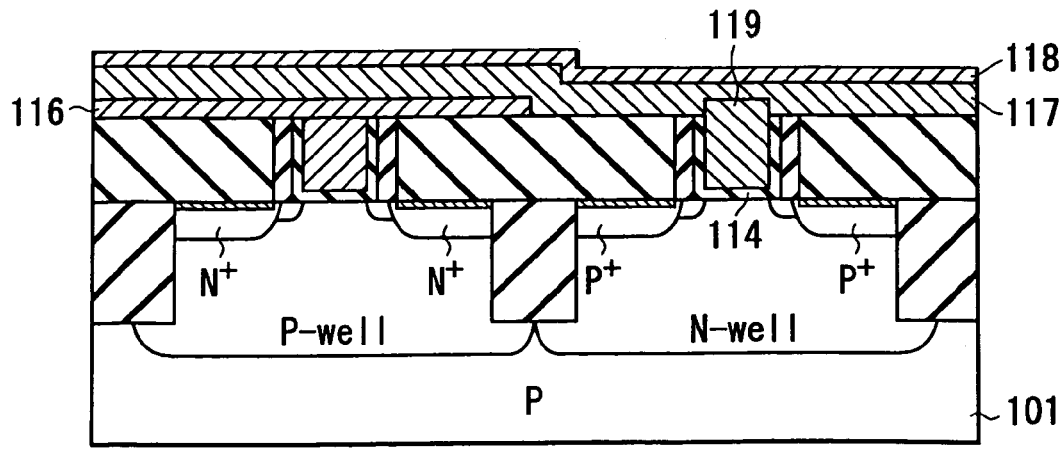
Figure 1J:
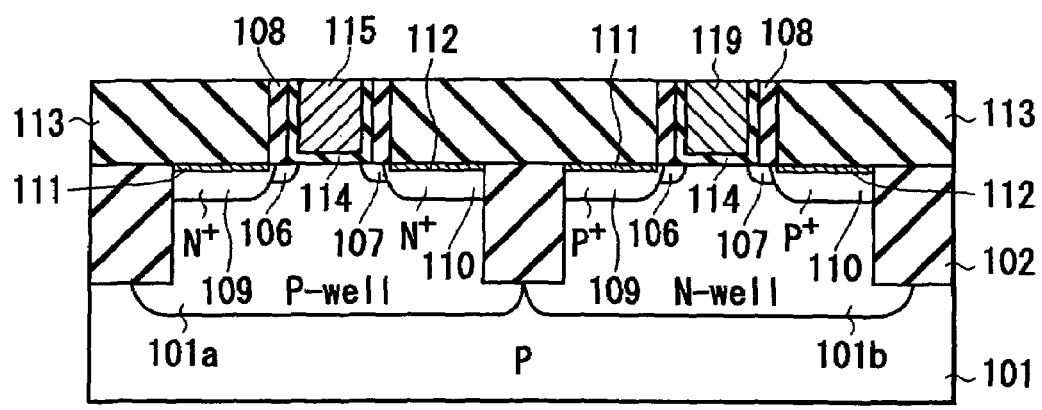

FIGS. 1A to 1J are sectional views showing a series of steps of manufacturing a semiconductor device including MISFETs according to a first embodiment. FIG. 1J shows the semiconductor device including MISFETs. Though both the N-channel MISFET and the P-channel MISFET are formed in the first embodiment, only a region of the N-channel MISFET is typically shown in the steps of FIGS. 1A to 1E. The steps from FIG. 1G are shown for both the N-channel MISFET and the P-channel MISFET.

As shown in FIG. 1A, an oxide film is selectively formed in a P-type silicon substrate 101 by an STI (shallow trench isolation) process or LOCOS (local oxidation of silicon) process to provide an isolation region 102 therein. Boron ions are implanted into the substrate 101 at a dose of $1\times10^{12}$ $cm^{-2}$ to $1\times10^{14}$ $cm^{-2}$. Thereafter, the doped impurity is activated by, e.g. rapidly heating for 10 seconds to form a P-type well region 101a. The P-type well region 101a surrounded by the isolation region 102 becomes the N-channel MISFET region.

A dummy gate structure, which is removed in a post-process, is formed. That is, the silicon oxide film having a thickness of, e.g. 6 nm is formed by thermal oxidation. A P-type impurity is introduced by an ion implantation method in order to control a threshold voltage of the N-channel MISFET. Subsequently, a polysilicon film having the thickness of, e.g. about 100 nm is deposited by CVD method, and a silicon nitride film having the thickness of, e.g. 20 nm is formed. These films are patterned by a lithography method, dry etching, or the like to provide an insulating film 103, a conductive film 104, and a first cap film 105, which become the dummy gate structure. Extension regions 106 and 107 are formed by the ion implantation using the first cap film 105, the conductive film 104, and the isolation film 103, which are patterned, as a mask. That is, arsenic ions or phosphorus ions are implanted at the dose of $1\times10^{13}$ $cm^{-2}$ to $5\times10^{15}$ $cm^{-2}$, and then the doped impurity is activated by, e.g. rapid heating for several seconds. The extension regions 106 and 107 may be formed by the ion implantation without patterning the insulating film 103 and then the insulating film 103 may be patterned.

As shown in FIG. 1B, after the silicon nitride film having the thickness of 20 to 40 nm is formed over the silicon substrate 101 by CVD method, anisotropic etching is carried out by RIE, and a sidewall insulating film 108 is formed on a sidewall of the dummy gate. Source and drain regions 109 and 110 are provided in such a manner that the arsenic ions or the phosphorus ions are implanted at the dose of $1\times10^{15}$ $cm^{-2}$ to $1\times10^{16}$ $cm^{-2}$ and then the rapid heating is carried out at 950° C. for 10 seconds.

Though it is not shown, after a cobalt film is deposited over the silicon substrate 101 by sputtering, a heat treatment is carried out to react only with silicon layers of the source and drain regions 109 and 110, thereby providing a cobalt silicide layer. As a result, first metal silicide electrode layers 111 and 112 are selectively formed on the source and drain regions 109 and 110. The remaining cobalt film is selectively removed by etching.

As shown in FIG. 1C, after the silicon oxide film is deposited over the substrate surface by CVD method, it is grinded by CMP until an upper surface of the sidewall insulating film 108 is exposed, thereby providing a planarized interlayer insulating film 113.

As shown in FIG. 1D, the first cap film 105 composed of the silicon nitride film is selectively removed from the substrate surface by using, e.g. phosphoric acid. Further, the conductive film 104 of the polysilicon film is selectively removed from the substrate surface by the etching technique using radical of a halogenic atom such as fluorine. A space region 108a described later, in which the gate insulating film and the gate electrode are buried, is formed by removing the insulating film 103 with dilute hydrofluoric acid or the like.

As shown in FIG. 1E, a hafnium oxide film 113a which is a high-dielectric insulating film is deposited over the substrate surface by CVD or the sputtering. Subsequently, a tungsten silicide film 113b is deposited by CVD or the sputtering.

As shown in FIG. 1F, the substrate surface is polished by CMP to planarize, the tungsten silicide film 113b and the hafnium oxide film 113a are buried in the space region 108a, and a gate insulating film 114 and a first metal silicide film 115 which become the gate electrode of the N-channel MISFET are provided.

The N-channel MISFET is formed by the above-described steps. The P-channel MISFET is also formed in the same manufacturing procedure as for the N-channel MISFET.

In FIGS. 1G to 1J, the P-channel MISFET is shown together with the N-channel MISFET, and a step of forming the electrode of the P-channel MISFET is shown. That is, an N-type impurity is introduced into the P-type silicon substrate 101 to provide an N-type well region 101b surrounded by the isolation region 102. In the same way for the N-channel MISFET, the P-channel MISFET is structured by forming the source and drain regions and the gate structure in the N-type well region 101b. Therefore, the same portions are indicated by the same reference numbers.

First, as shown in FIG. 1G, in order to prevent a reaction of the first metal silicide film 115 constituting the gate electrode of the N-channel MISFET, a titanium nitride film is deposited on the substrate surface by the sputtering or the like. Thereafter, a barrier metal film 116 is formed in such a manner that the titanium nitride film is left only on the N-channel MISFET region by using the lithography technique and the etching technique.

As shown in FIG. 1H, a platinum film is deposited over the substrate surface by, e.g. the sputtering to form a first metal film 117 which becomes a constituent material for the gate electrode of the P-channel MISFET. Further, the titanium nitride film is deposited by the sputtering or the like to form a second cap film 118. Then, by carrying out heat treatment, a solid phase reaction occurs between the first metal film 117, formed on the first metal silicide film 115 of the P-channel MISFET, and the first metal silicide film 115.

Namely, the tungsten silicide is decomposed into tungsten and silicon as the basic reaction, the tungsten is precipitated, and the silicon bonds to platinum to form platinum silicide.

As a result, as shown in FIG. 1I, the platinum silicide forms the gate electrode of the P-channel MISFET as a second silicide film 119. In this case, since the second metal silicide film 119 contains tungsten, behavior of the tungsten in the solid phase reaction is affected by changing a silicon composition ratio in the tungsten silicide or heat treatment conditions. Consequently, existence form of the tungsten and the like are also changed. It will be described later.

On the other hand, in the gate electrode of the N-channel MISFET, since the barrier metal film 116 formed under the first metal film 117 suppresses diffusion and reaction of a constituent atom of the first metal film 117 to the first metal silicide film 115, the first metal silicide film 115 remains with an original state.

As shown in FIG. 1J, the second cap film 118, the unreacted first metal film 117, and the barrier metal film 116 are removed by the CMP technique, the etching technique or the like to planarize the surface.

Thereafter, an interlayer insulating film (not shown), such as $SiO_2$, is deposited on the substrate surface. Contact holes are made in the interlayer insulating film, and a metal wiring layer made of the material such as Al and Cu is formed on the first metal silicide film 115 which is the gate electrode of the N-channel MISFET, the second metal silicide film 119 which is the gate electrode of the P-channel MISFET, and the first metal silicide electrode layers 111 and 112 which are the electrode layers of the source and drain, respectively. Further, after a multilayer wiring structure is optionally formed by repeating the deposition of the interlayer insulating film and the formation of the metal wiring layer, the substrate surface is covered with a surface protective film, and pad portions are opened to complete the semiconductor device.

The structure of the second silicide film 119 which becomes the above-described gate electrode of the P-channel MISFET will be described below referring to FIGS. 2A to 2D.

The structure of the second-metal silicide film 119 is mainly composed of a platinum silicide film, and the existence form of the tungsten is changed by the thicknesses of the tungsten silicide film and the platinum film, the composition ratio between the silicon and the tungsten in the tungsten silicide film, the heat treatment conditions in the reaction, and the like.

Figure 2A:
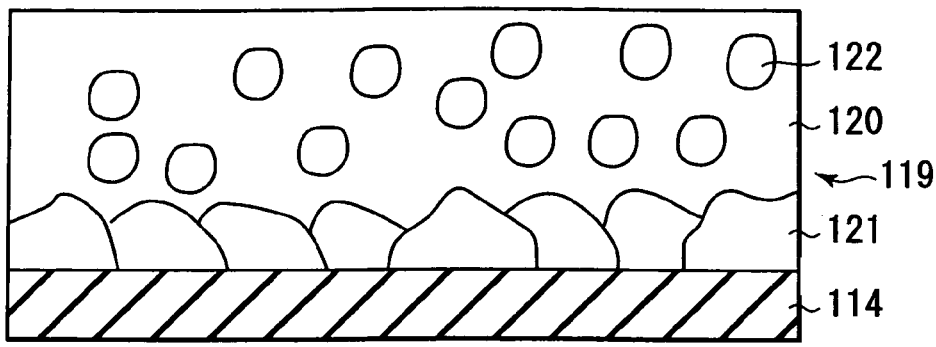
FIGS. 2A to 2D are sectional vies showing various kinds of gate electrode structures of a P-channel MISFET in the first embodiment.

FIG. 2A shows a first structural example. In the second metal silicide film 119 of the structural example, a precipitation layer 121 made of tungsten or tungsten silicide is formed at a portion adjacent to the gate insulating film 114, and particles or grains 122 made of tungsten or tungsten silicide are present in a platinum silicide layer 120. Sometimes silicon is also contained in the precipitation layer 121 made of tungsten or tungsten silicide and the grains 122 made of tungsten or tungsten silicide, and tungsten silicide is often contained as a crystal structure. However, since the tungsten silicide is one in which the silicon has been precipitated from the tungsten silicide as the first metal silicide constituting the gate electrode of the N-channel MISFET, silicon content of the tungsten silicide is lower than the first metal silicide. That is, the tungsten silicide has the form of a third metal silicide which differs from the first metal silicide in the silicon content. Similarly to the first structural example, sometimes the following second to fourth structural examples contain the third metal silicide.

Figure 2B:
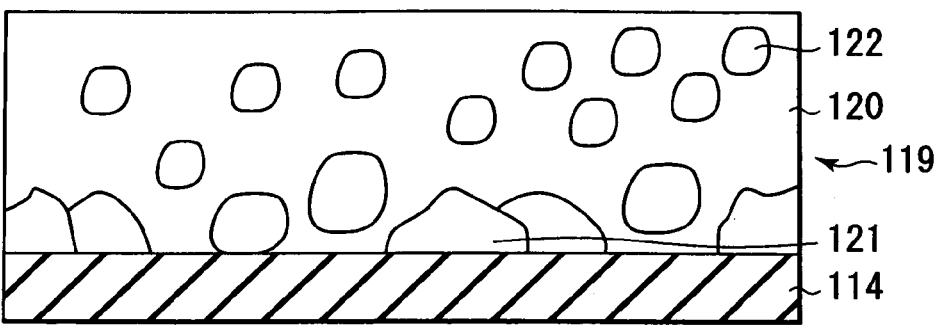

FIG. 2B shows a second structural example of the second metal silicide film 119. The precipitation layer 121 made of tungsten or tungsten silicide does not cover the whole surface of the gate insulating film 114, and part of the platinum silicide layer 120 is in contact with the gate insulating film 114.

Figure 2C:
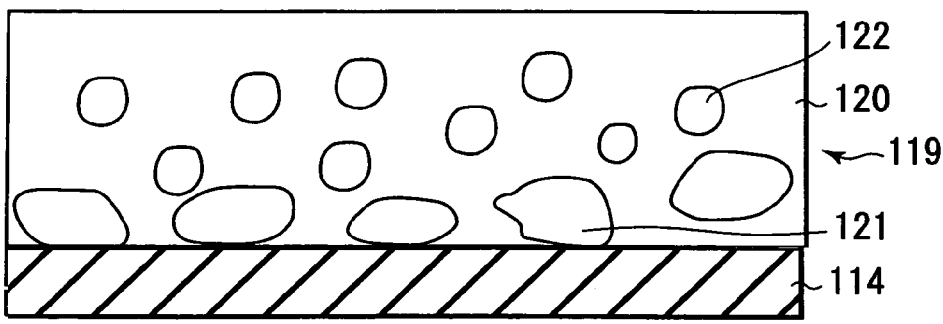

FIG. 2C shows a third structural example of the second metal silicide film 119. The precipitation layer 121 made of tungsten or tungsten silicide is almost grained near an interface of the gate insulating film 114. Therefore, the platinum silicide layer 120 is dominant in the region which is in contact with the gate insulating film 114.

Figure 2D:
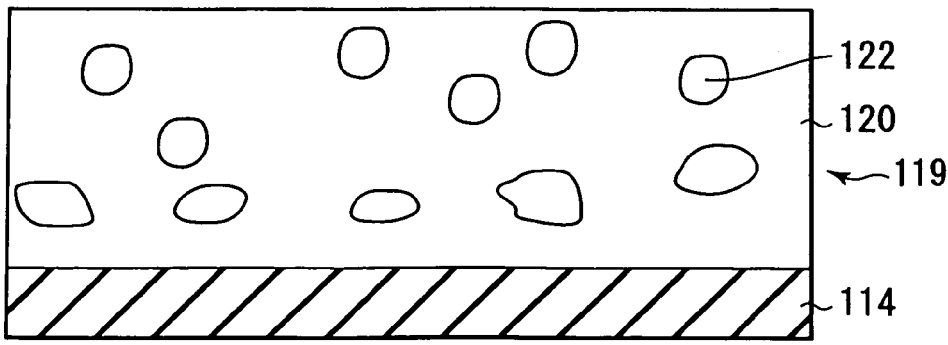

FIG. 2D shows a fourth structural example of the second metal silicide film 119. This structural example occurs in the case that the film thickness of tungsten silicide is thinner than that of the first to third structural examples. That is, the fourth structural example is the case that the mount of tungsten is not much such that tungsten or tungsten silicide precipitates in the region which is in contact with the gate insulating film 114. Accordingly, the region which is in contact with the gate insulating film 114 is thoroughly covered with the platinum silicide film 120. Needless to say, sometimes there is the case that tungsten is hardly precipitated in the platinum silicide film 120.

In the structural examples of FIGS. 2A to 2D, the region having the thickness of about 1 nm, which is in contact with the gate insulating film 114 in which a work function of the gate electrode is determined, contains at least one of platinum silicide, tungsten, and the third metal silicide whose silicon content is lower than that of the tungsten silicide which is the first metal silicide. Because both the work functions of platinum silicide and tungsten are about 4.8 to 4.9 eV, the work functions become a proper value for the gate electrode of the P-channel MISFET. On the other hand, the gate electrode of the N-channel MISFET is tungsten silicide and its work function is 4.3 to 4.6 eV, so that the work function becomes the proper value for the gate electrode of the N-channel MISFET.

Since the work function of tungsten silicide is increased as the silicon content of tungsten silicide is decreased, even when the gate electrode of the P-channel MISFET includes the third metal silicide, the work function of the gate electrode of the P-channel MISFET has the value larger than that of the work function of the gate electrode of the N-channel MISFET. Therefore, the gate electrode shown in the above-described first embodiment becomes the optimum structure as the complementary circuit constituting the integrated circuit.

For the above-described reasons, it is desirable that the number of silicon atoms per unit volume is 2.5 times not lower than the number of metal atoms per unit volume in the composition ratio between silicon and metal constituting the first metal silicide 115 which is the gate electrode of the N-channel MISFET. Further, it is desirable that the number of silicon atoms per unit volume is not more than the number of metal atoms per unit volume in the composition ratio between silicon and metal constituting the third metal silicide which is the gate electrode of the P-channel MISFET. Molybdenum, titanium, zirconium, hafnium, tantalum, niobium, and the like are applicable to the metal constituting the first metal silicide instead of tungsten. On the other hand, palladium and rhodium are applicable to the metal constituting the second metal silicide instead of platinum.

According to the first embodiment, in the P-channel MISFET, a gate electrode made of a material different from that of the gate electrode of the N-channel MISFET can be formed without exposing the surface of the gate insulating film to etching gas or chemicals. Accordingly, the semiconductor device including MISFETs, in which both gate electrodes of the N- and P-channel MISFETs have the proper work functions, the threshold voltage is easily controlled, and reliability of the gate insulating film is excellent, and the method of manufacturing the same can be obtained.

A method of manufacturing a semiconductor device including MISFETs according to a second embodiment will be described referring to FIGS. 3A to 3K.

Though both the N-channel MISFET and the P-channel MISFET are formed in the second embodiment, only the region of the N-channel MISFET is typically shown in the steps of FIGS. 3A to 3E. The steps from FIG. 3F are shown for both the N-channel MISFET and the P-channel MISFET.

The manufacturing method of the embodiment is characterized in that the metal silicide electrode layer is formed on the upper surface of the source and drain regions after the film formation of the gate insulating film and the gate electrode is carried out.

Figure 3A:
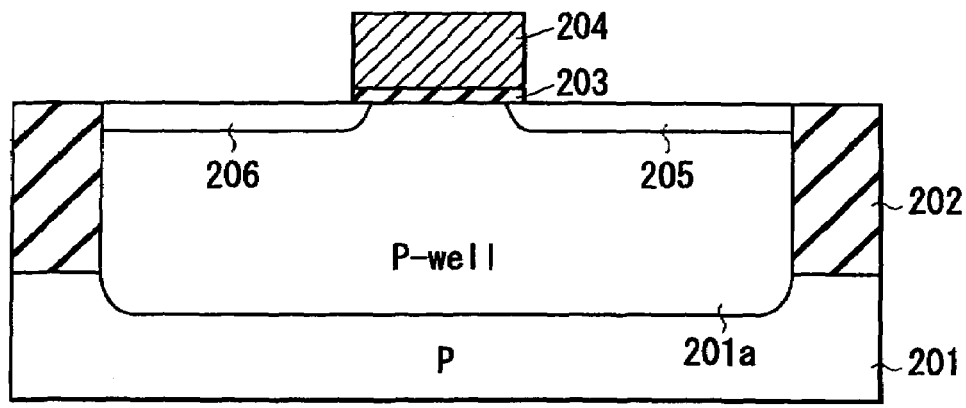
FIGS. 3A to 3K are sectional views showing a series of steps of manufacturing a semiconductor device according to a second embodiment.

As shown in FIG. 3A, an oxide film is selectively formed in a P-type silicon substrate 201 by STI (shallow trench isolation) process or LOCOS (local oxidation of silicon) process to provide an isolation region 202 therein. Boron ions are implanted at a dose of $1 \times 10^{12}$ cm$^{-2}$ to $1 \times 10^{14}$ cm$^{-2}$ using the ion implantation. Then, the doped impurity is activated by, e.g. rapid heating for 10 seconds to form a P-type well region 201a. The P-type well region 201a surrounded by the isolation region 202 becomes the N-channel MISFET region.

The dummy gate structure, which is removed in a post-process, is formed. That is, the silicon oxide film having a thickness of, e.g. 8 nm is formed by thermal oxidation. A P-type impurity is introduced by an ion implantation in order to control the threshold voltage of the N-channel MISFET. Then, a polysilicon film having the thickness of, e.g. about 200 nm is deposited by CVD. By patterning these films using the lithography, the dry etching, or the like, an insulating film 203 and a conductive film 204 which become the dummy gate structure are provided. Extension regions 205 and 206 are formed by the ion implantation using the conductive film 204 and the insulating film 203, which are patterned, as a mask. That is, arsenic ions or phosphorus ions are implanted by the dose of $1 \times 10^{13}$ cm$^{-2}$ to $5 \times 10^{15}$ cm$^{-2}$, and then the doped impurity is activated by, e.g. the rapid heating at 900° C. for 5 seconds.

Figure 3B:
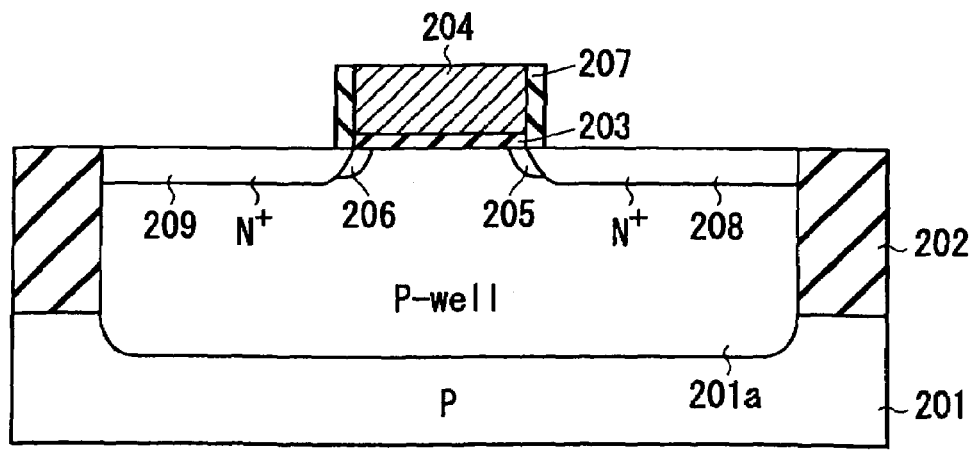

As shown in FIG. 3B, after the silicon nitride film having the thickness of about 300 nm is formed on the silicon substrate 201 by CVD, anisotropic etching is carried out by RIE, and a sidewall insulating film 207 is formed around the dummy gate structure while the sidewall insulating film 207 is in contact with the dummy gate structure. Source and drain regions 208 and 209 are provided in such a manner that the arsenic ions or the phosphorus ions are implanted again at the dose of $1 \times 10^{15}$ cm$^{-2}$ to $1 \times 10^{16}$ cm$^{-2}$ and then the rapid heating is carried out at 900° C. for 10 seconds.

Figure 3C:
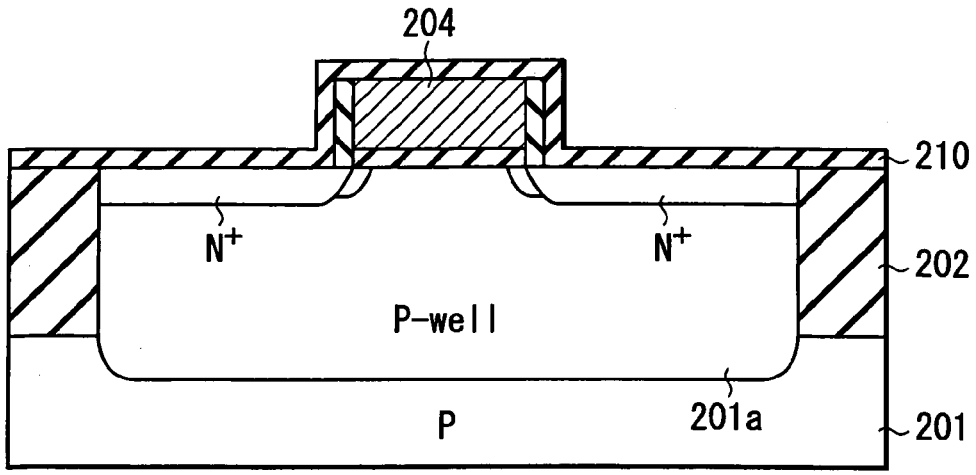

As shown in FIG. 3C, the silicon nitride film 210 having the thickness of, e.g. 10 nm is deposited on the silicon substrate surface 201 to provide a third cap film 210.

Figure 3D:
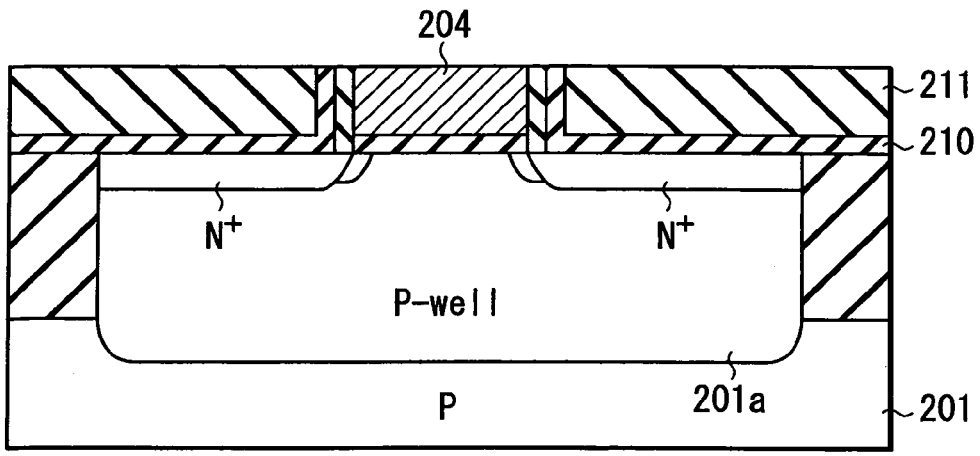

As shown in FIG. 3D, for example the silicon oxide film is deposited by CVD, the above-described insulating film is polished to planarize the surface by the CMP technique until the upper surface of the third cap film 210 is exposed, and the a buried insulating film 211 is provided. Then, the silicon nitride film on the conductive film 204, which is a part of the third cap film 210, is selectively removed.

Figure 3E:
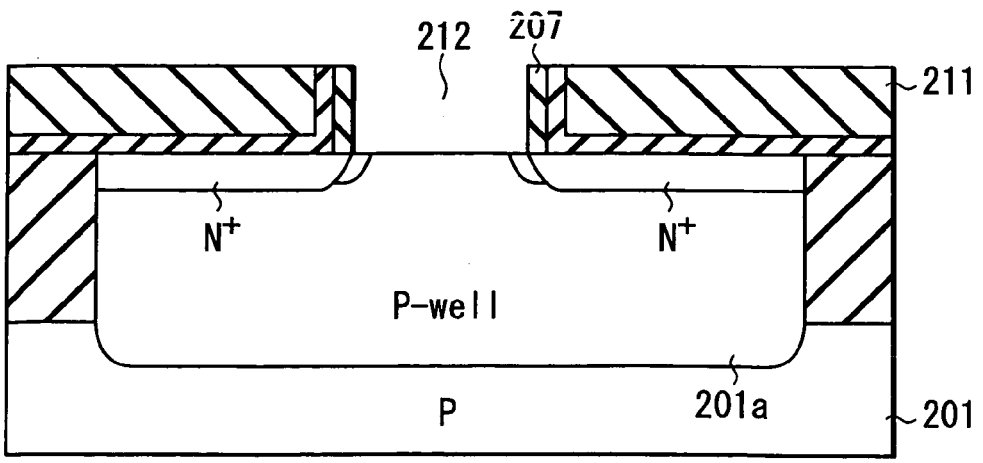
Figure 3F:
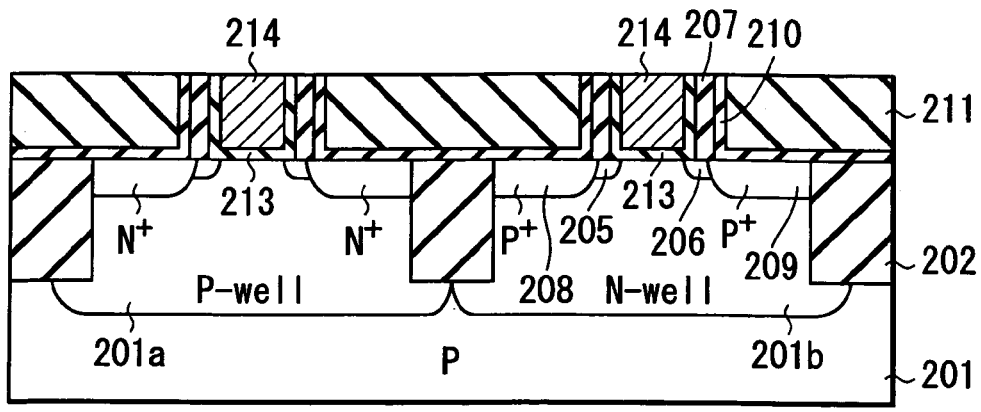

As shown in FIG. 3E, the conductive film 204 is removed by the etching technique using radical of a halogenic atom such as fluorine. Then, a space region 212 described later, in which the gate insulating film and the gate electrode are buried, is formed by removing the insulating film 203 with dilute hydrofluoric acid or the like.

As described above, the N-channel MISFET except the gate insulating film and gate electrode is provided. The P-channel MISFET can be formed in the same manufacturing steps for the N-channel MISFET. That is, similarly to the N-channel MISFET, the P-channel MISFET is provided by forming the source and drain regions and the gate structure in the N-type well region 201b. Therefore, the same portions are indicated by the same reference numbers.

As shown in FIG. 3F, a hafnium oxide film which is a high-dielectric insulating film is deposited over the silicon substrate 201 by CVD or the sputtering. Thereafter, the tungsten silicide film is deposited by CVD or the sputtering and a whole of the silicon substrate surface is grinded by CMP. Accordingly, the planarization is carried out so that the buried insulating film 211 is exposed, and a gate insulating film 213 and a first metal silicide film 214 which becomes the gate electrode of the N-channel MISFET are provided.

Figure 3G:
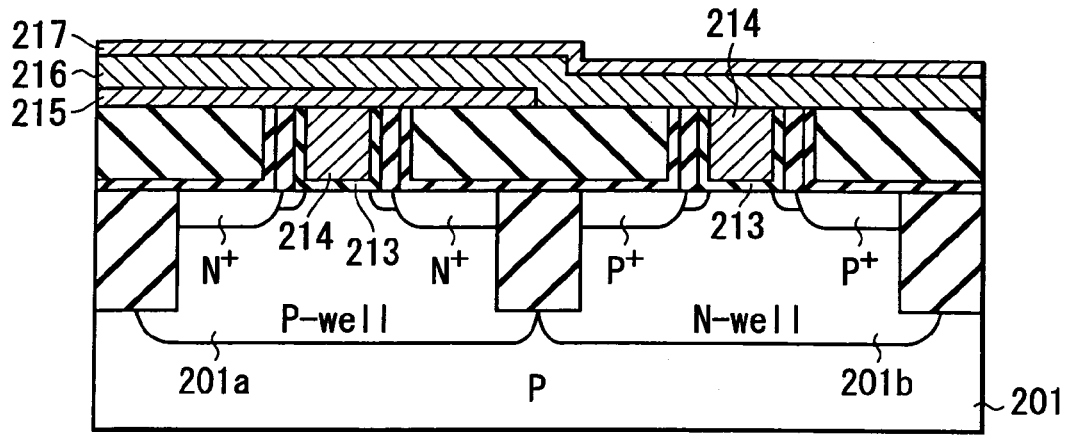

As shown in FIG. 3G, in order to prevent the reaction of the first metal silicide film 214 and the gate insulating film 213, after the titanium nitride film is formed over the substrate surface by the sputtering or the like, it is patterned to remain only on the N-channel MISFET region, thereby providing a barrier metal film 215. The platinum film is deposited over the substrate surface by the sputtering or the like to form a first metal film 216 which becomes a constituent material for the gate electrode of the P-channel MISFET. Further, the titanium nitride film is deposited over the first metal film 216 by the sputtering or the like to form a second cap film 217.

Figure 3H:
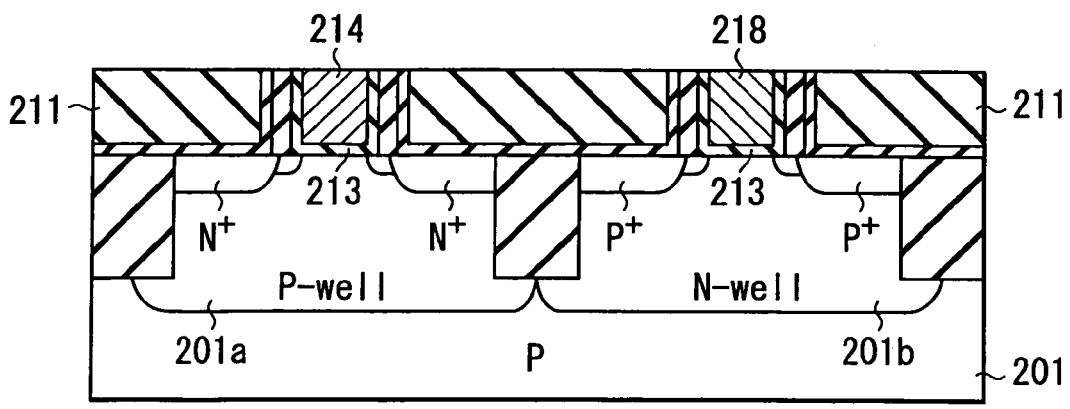

Thereafter, as shown in FIG. 3H, by carrying out the heat treatment, a solid phase reaction occurs between the first metal film 216, formed on the first metal silicide film 214 of the P-channel MISFET, and the first metal silicide film 115. As a result, a second metal silicide 218 is formed as the gate electrode of the P-channel MISFET. Then, the planarization of the substrate surface is carried out, while the second cap film 217, the first metal film 216 which is the untreated platinum, and the barrier metal film 215 are removed by the CMP technique, the etching technique or the like.

Figure 3I:
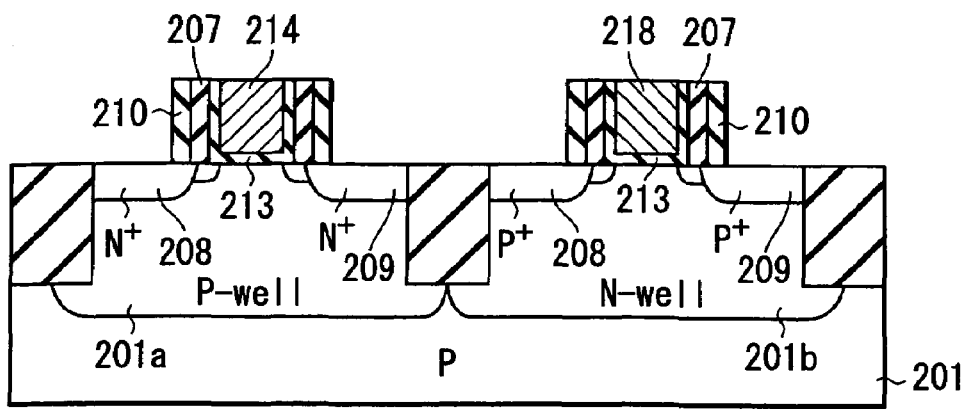

As shown in FIG. 3I, the buried insulating film 211 is removed with the chemicals such as hydrofluoric acid or dry etching. The third cap film 210 which is the silicon nitride film is anisotropically etched by using the dry etching such as RIE to remain on the sidewall of the sidewall insulating film 207, and the upper surfaces of the source and drain regions 208 and 209 are exposed.

Figure 3J:
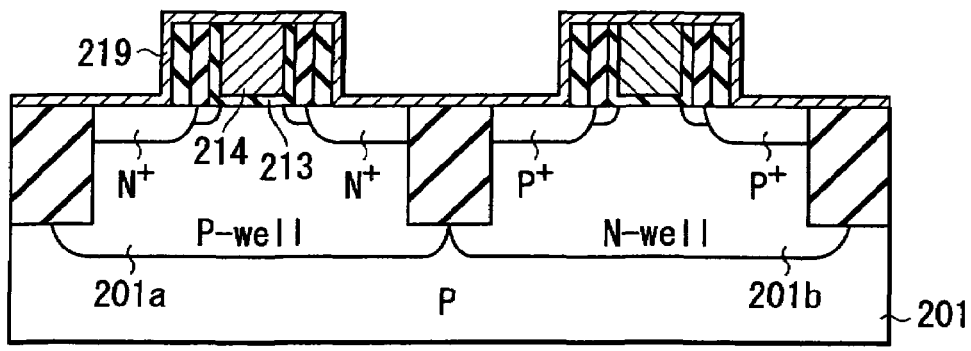

As shown in FIG. 3J, nickel is deposited over the substrate surface by the sputtering or the like to form a second metal film 219.

Figure 3K:
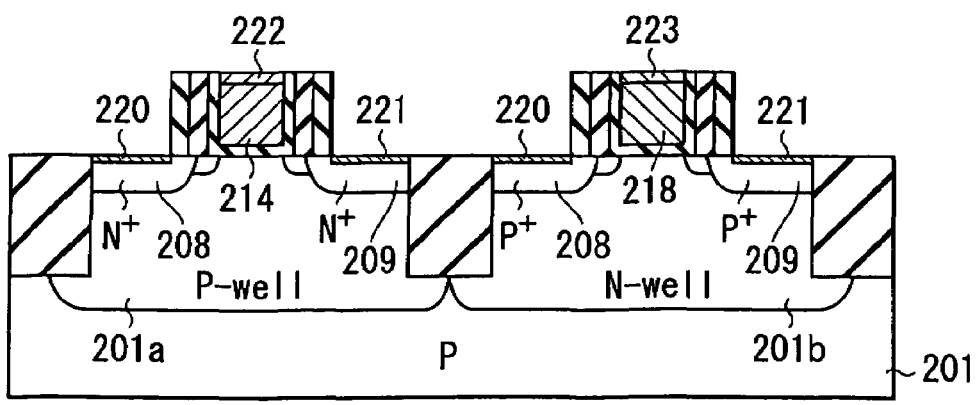

As shown in FIG. 3K, by the heat treatment at about 500° C., nickel silicide is formed on the source and drain regions 208 and 209 and the first and second metal silicide films 214 and 218, and second silicide electrode layers 220, 221, 222, and 223 are formed respectively. Then, the unreacted second metal film 219 is removed with the chemical solution.

Then, an interlayer insulating film (not shown), such as $SiO_2$, is deposited over the silicon substrate 201. Contact holes are made in the interlayer insulating film, and a metal wiring layer made of the material such as Al and Cu is connected to the first metal silicide film 214 which is the gate electrode of the N-channel MISFET, the second metal silicide film 218 which is the gate electrode of the P-channel MISFET, and the second metal silicide electrode layers 220 and 221 which are the electrodes of the source and drain regions, respectively. Further, after the multilayer wiring structure is optionally formed by repeating the deposition of the interlayer insulating film and the formation of the metal wiring layers, the whole surface of the silicon substrate 201 is covered with a surface protective film, and pad portions are opened to complete the semiconductor device including MISFETS.

According to the second embodiment, in the P-channel MISFET, a gate electrode made of a material different from that of the gate electrode of the N-channel MISFET can be formed without exposing the surface of the gate insulating film to etching gas or chemicals. Accordingly, the semiconductor device including MISFETs, in which both gate electrodes of the N- and P-channel MISFETs have the proper work functions, the threshold voltage is easily controlled, and reliability of the gate insulating film is excellent, and the method of manufacturing the same can be obtained.

Moreover, the silicide electrode layer can be formed on the source and drain regions after the heat treatment process of the relatively high temperature, which forms the gate electrode structure including the gate insulating film and the gate electrode film. Compared with cobalt, titanium, and the like, nickel is preferable because it reacts with silicon at lower temperature to form silicide. Further, nickel silicide is the excellent material for high-speed operation of the element because nickel silicide has relatively low resistance.

A method of manufacturing a semiconductor device including MISFETs according to a third embodiment will be described referring to FIGS. 4A to 4H.

Figure 4A:
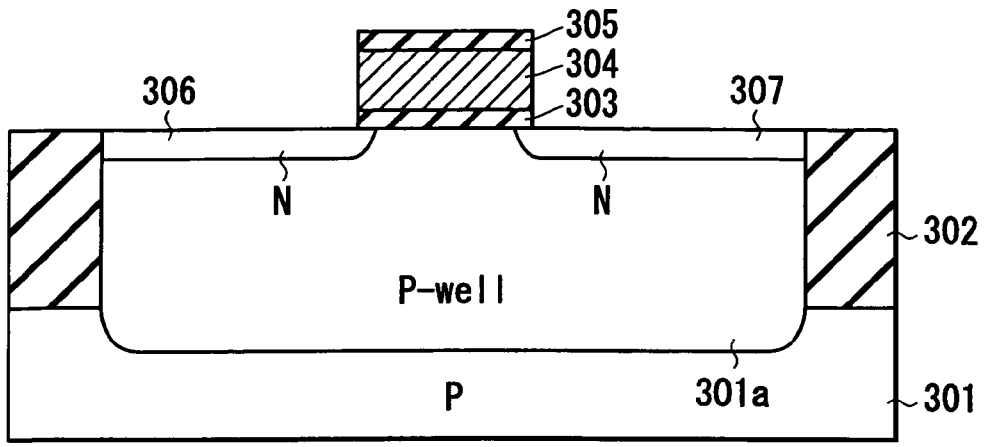
FIGS. 4A to 4H are sectional views showing a series of steps of manufacturing a semiconductor device according to a third embodiment.
Figure 4B:
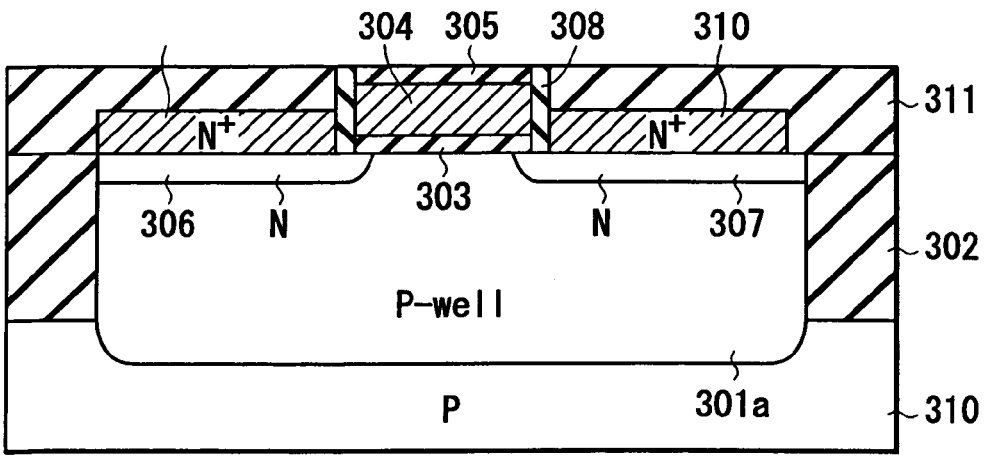
Figure 4C:
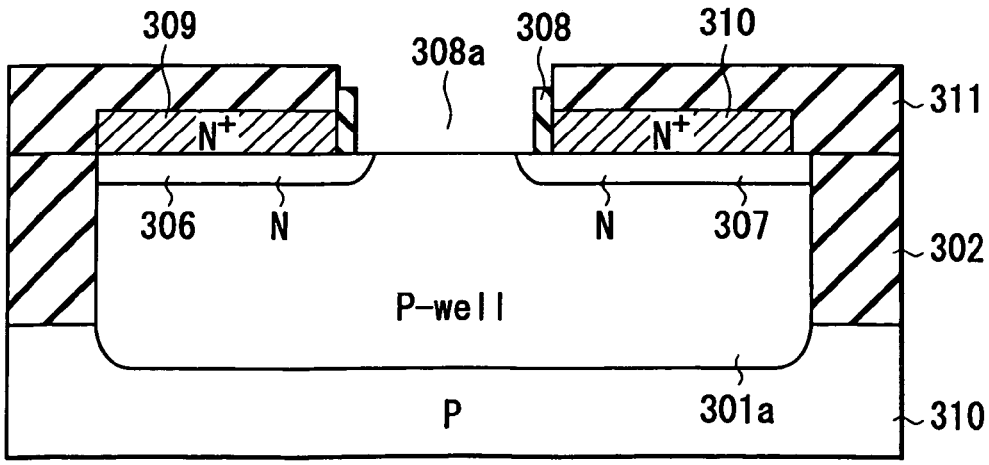
Figure 4D:
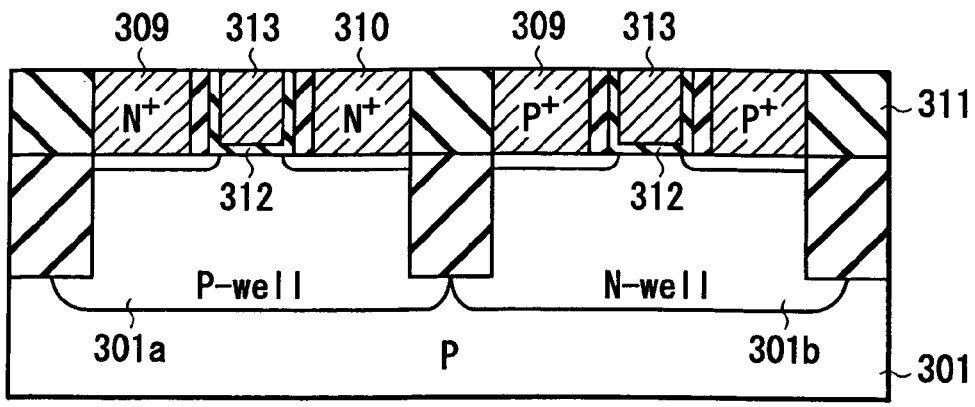

Though both the N-channel MISFET and the P-channel MISFET are also formed in the third embodiment, only the region of the N-channel MISFET is typically shown in the steps of FIGS. 4A to 4C. The steps from FIG. 4D are shown for both the N-channel MISFET and the P-channel MISFET.

In the embodiment, the silicon film for the source and drain regions is selectively grown on the silicon substrate surface to form elevated source and drain regions.

As shown in FIG. 4A, an isolation region 302 is formed in a P-type silicon substrate 301 in a manner so as to selectively form an oxide film by STI (shallow trench isolation) process or LOCOS (local oxidation of silicon) process. Boron ions are implanted at the dose of $1 \times 10^{12}$ $cm^{-2}$ to $1 \times 10^{14}$ $cm^{-2}$ using the ion implantation. Then, the doped impurity is activated by, e.g. rapid heating for 10 seconds to form a P-type well region 301a. The P-type well region 301a surrounded by the isolation region 302 becomes the N-channel MISFET region.

The dummy gate structure, which is removed in a post-process, is provided. That is, the silicon oxide film having the thickness of, e.g. 6 nm is formed by the thermal oxidation. A P-type impurity is introduced by ion implantation to control the threshold voltage of the N-channel MISFET. Subsequently, a polysilicon film having the thickness of, e.g. about 100 nm is deposited by CVD. By patterning these films using the lithography, the dry etching, or the like, a first cap film 305, a conductive film 304, and an insulating film 303 which become the dummy gate structure are formed. Extension regions 306 and 307 are formed by the ion implantation using the first cap film 305, the conductive film 304, and the insulating film 303, which are patterned, as a mask. That is, arsenic ions or phosphorus ions are implanted at the dose of $1 \times 10^{13}$ $cm^{-2}$ to $5 \times 10^{15}$ $cm^{-2}$, and then the doped impurity is activated by, e.g. the rapid heating at for several seconds.

As shown in FIG. 4B, the silicon nitride film having the thickness of 20 to 40 nm is formed on the substrate surface by CVD. The anisotropic etching is carried out by RIE, and a sidewall insulating film 308 made of the silicon nitride film is provided around the dummy gate structure. Elevated source and drain regions 309 and 310 are formed in such a manner that the silicon film having the thickness of about 50 nm is selectively grown on the extension regions 306 and 307.

After the arsenic ions or the phosphorus ions are implanted at the dose of about $1 \times 10^{15}$ $cm^{-2}$ to $1 \times 10^{16}$ $cm^{-2}$, the doped impurity is activated by, e.g. the rapid heating at 950° C. for 10 seconds. At the result, the impurity is introduced into the elevated source and drain regions. The extension region and the elevated source and drain regions in this step may be simultaneously formed by solid phase diffusion of the impurity in forming the elevated source and drain regions 309 and 310. An interlayer insulating film 311 is formed in such a manner that the silicon oxide film is deposited on the substrate surface by CVD and the planarization is carried out until the upper surface of the cap film 305 is exposed by CMP.

As shown in FIG. 4C, the first cap film 305 is removed by the etching with, e.g. phosphoric acid. Further, the conductive film 304 is removed by the etching technique using radical of halogenic atoms such as fluorine. Then, a space region 308a described later, in which the gate insulating film and the gate electrode are buried, is formed by removing the insulating film 303 with dilute hydrofluoric acid or the like.

As described above, the N-channel MISFET except the gate insulating film and gate electrode is provided. The P-channel MISFET can be formed in the same manufacturing steps for the N-channel MISFET. That is, similarly to the N-channel MISFET, the P-channel MISFET is structured by forming the source and drain regions and the gate structure in the N-type well region 301b. Therefore, the same portions are indicated by the same reference numbers.

As shown in FIG. 4D, a hafnium oxide film which is a high-dielectric insulating film is deposited by CVD or the sputtering so that the space region 308a is buried. Then, the tungsten silicide film is formed on the hafnium oxide film by CVD or the sputtering to provide a gate insulating film 312 and a first metal silicide film 313. The substrate surface is polished by CMP to planarize until the interlayer insulating film 311 and the upper surface of the silicon film of the elevated source and drain regions 309 and 310 are exposed.

Figure 4E:
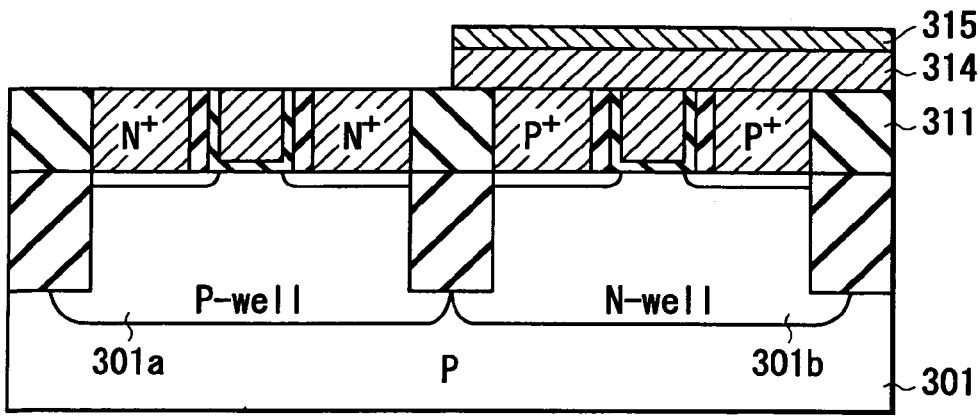

As shown in FIG. 4E, the platinum film is deposited on the substrate surface by, e.g. the sputtering, and the titanium nitride film is deposited on the platinum film by, e.g. sputtering. A first metal film 314 and a fourth cap film 315, which become the constituent material of the gate electrode of the P-channel MISFET, are selectively left only on the P-channel MISFET region using the lithography and etching techniques.

Figure 4F:
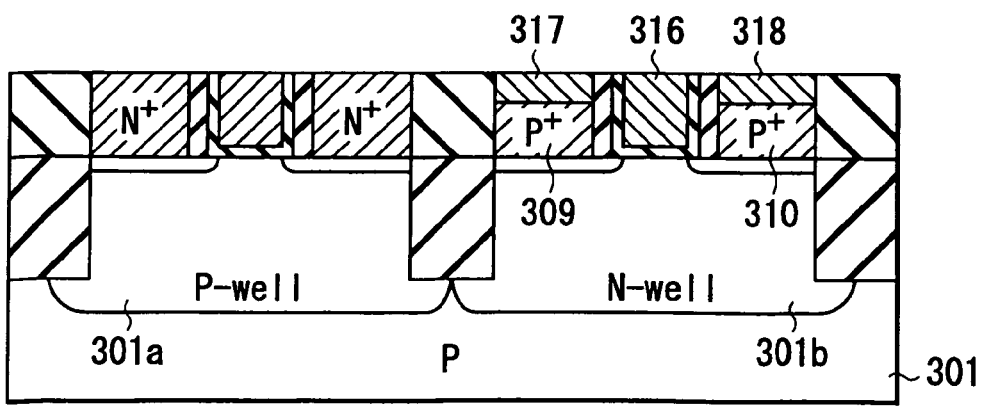

As shown in FIG. 4F, by carrying out heat treatment at about 500° C., a solid phase reaction occurs between the first metal silicide film 313 of the P-channel MISFET and the first metal film 314 formed on the first metal silicide film 313, whereby a second metal silicide film 316 is provided as the gate electrode of the P-channel MISFET. The platinum silicide film is grown in the elevated source and drain region 309 and 310 of the P-channel MISFET, and third metal silicide electrodes 317 and 318 are provided.

Thereafter, the fourth cap film 315 is selectively removed with a mixed solution of sulfuric acid and hydrogen peroxide or the like, and the unreacted first metal film 314 is selectively removed with aqua regia or the like.

Figure 4G:
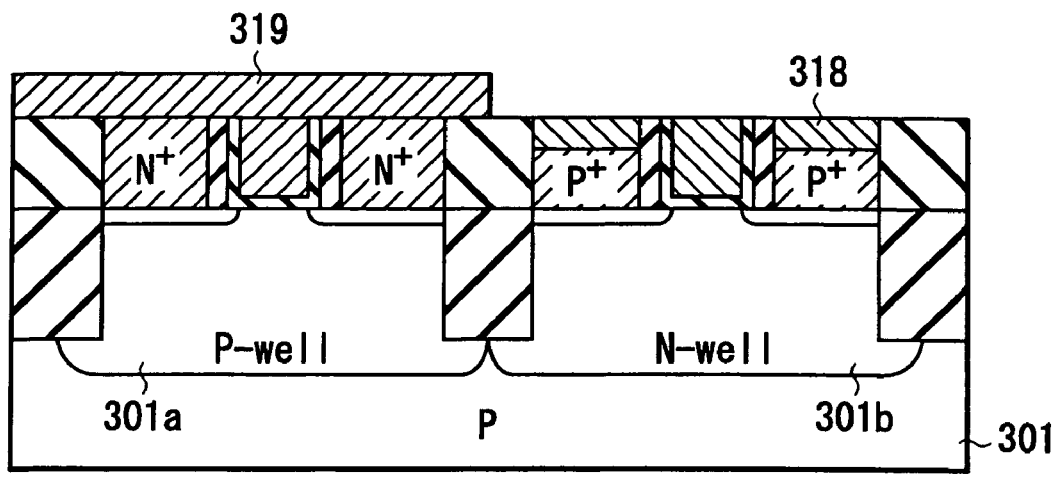

As shown in FIG. 4G, after titanium is deposited on the substrate surface by the sputtering or the like, it is selectively formed so as to remain only on the region of the N-channel MISFET by the lithography and the dry etching, thereby providing a third metal film 319 thereon.

Figure 4H:
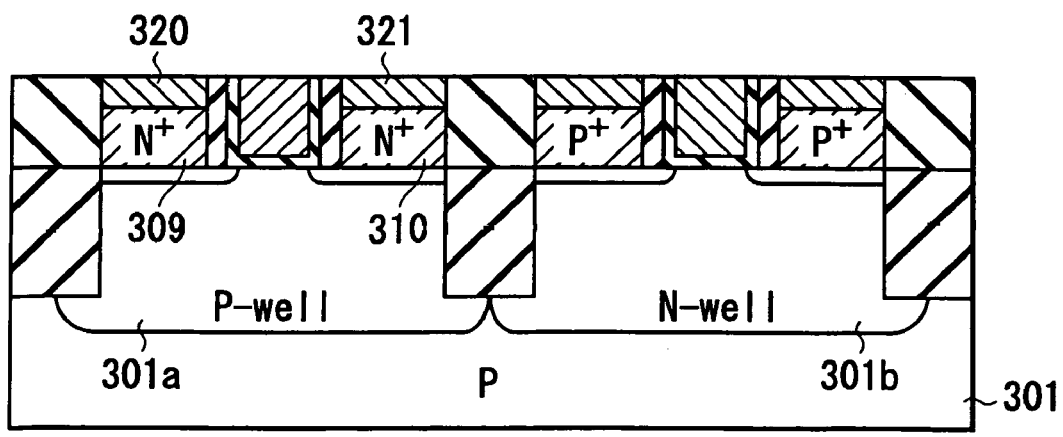

As shown in FIG. 4H, the heat treatment is carried out at about 500° C. Accordingly, titanium silicidation is carried out on the elevated source and drain regions 309 and 310 in the N-channel MISFET to provide fourth metal silicide electrode layers 320 and 321.

Thereafter, the unreacted third metal film 319 is selectively removed with the chemicals. In the above-described way, titanium silicide is formed on the source and drain regions of the N-channel MISFET and platinum silicide is formed on the source and drain regions of the P-channel MISFET.

Then, the interlayer insulating film (not shown), such as $SiO_2$, is deposited over the silicon substrate 301. Contact holes are made in the interlayer insulating film, and a metal wiring layer made of the material such as Al and Cu is provided on the first metal silicide film 313 which is the gate electrode of the N-channel MISFET, the second metal silicide film 316 which is the gate electrode of the P-channel MISFET, the third metal silicide electrode layers 317 and 318 which are the electrodes of the elevated source and drain regions 309 and 310, and the fourth metal silicide electrode layers 320 and 321, respectively. Further, after the multilayer wiring structure is optionally formed by repeating the deposition of the interlayer insulating film and the formation of the metal wiring layers, the whole surface of the silicon substrate 301 is covered with a surface protective film, and pad portions are opened to complete the semiconductor device including MISFETs.

According to the third embodiment, in the P-channel MISFET, a gate electrode made of a material different from that of the gate electrode of the N-channel MISFET can be formed without exposing the surface of the gate insulating film to the etching gas or the chemicals. Accordingly, the semiconductor device including MISFETs each having the gate structure, in which both gate electrodes of the N-channel MISFET and the P-channel MISFET have the proper work functions, the threshold voltage is easily controlled, and reliability of the gate insulating film is excellent, and the method of manufacturing the same can be obtained.

The structure capable of coping with further miniaturization of MISFET can be provided by forming the metal silicide electrode in the elevated source and drain regions of the N-channel MISFET and the P-channel MISFET.

In the embodiment, when the metal silicide is formed in the elevated source and drain regions, the formation is separately carried out in the N-channel MISFET and the P-channel MISFET. However, the formation can be simultaneously carried out by the following method. That is, after the first metal film 314 and the fourth cap film 315 are formed in the P-channel MISFET region, the third metal film 319 is formed without carrying out the heat treatment. The desired metal silicide can be simultaneously formed in the N-channel MISFET region and the P-channel MISFET region by carrying out the heat treatment after the formation of the third metal film 319.

A method of manufacturing a semiconductor device including MISFETs according to a fourth embodiment will be described referring to FIGS. 5A to 5F.

Both the N-channel MISFET and the P-channel MISFET are also shown in the fourth embodiment.

In the fourth embodiment, silicide of nickel, cobalt, or the like is formed on the upper surface of the source and drain and the gate like the second embodiment, the silicon film is selectively formed in the source and drain regions like the third embodiment, and the elevated source and drain regions are provided.

Figure 5A:
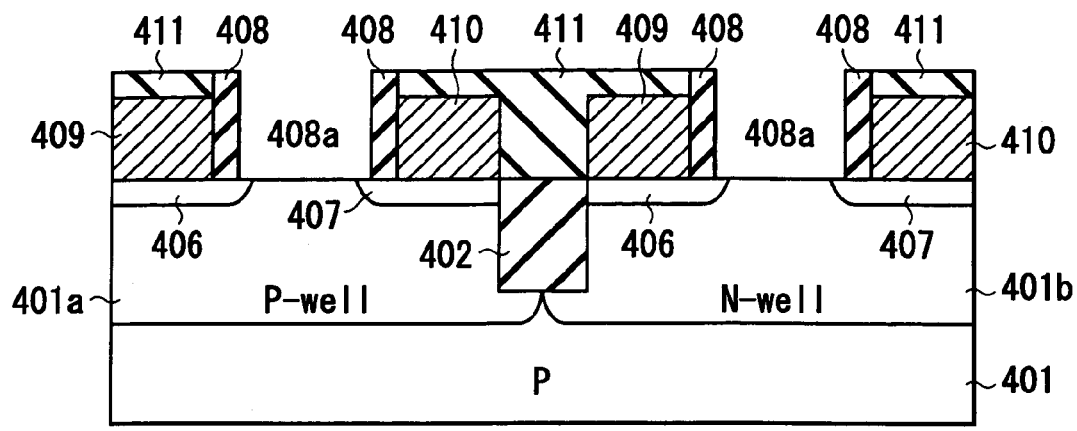
FIGS. 5A to 5F are sectional views showing a series of steps of manufacturing a semiconductor device according to a fourth embodiment.

Namely, as shown in FIG. 5A, a P-type silicon substrate 401 has P-type and N-type well regions 401a and 401b which are isolated by an isolation region 402, and extension regions 406 and 407 have already been formed in the P-type and N-type well regions 401a and 401b. A sidewall insulating film 408 which is in contact with the dummy gate structure (not shown) is formed, and elevated source and drain regions 409 and 410 are formed by selectively growing the silicon film on the extension regions 406 and 407. Further, on the elevated source and drain regions 409 and 410, an interlayer insulating film 411 is formed and a space region 408a described later, in which the gate insulating film and the gate electrode are buried, is formed by the same way as the third embodiment.

Figure 5B:
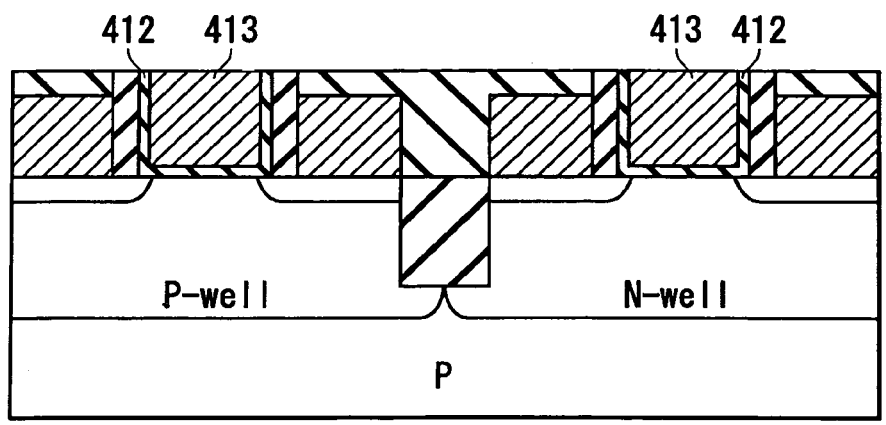

As shown in FIG. 5B, a hafnium oxide film which is a high-dielectric insulating film is deposited by CVD or the sputtering so that the space region 408a is buried. Then, the tungsten silicide film is grown on the hafnium oxide film by CVD or the sputtering to form a gate insulating film 412 and a first metal silicide film 413. In the third embodiment, the substrate surface is grinded by CMP to planarize until the interlayer insulating film 311 and the upper surface of the silicon film of the elevated source and drain regions 309 and 310 are exposed. However, in the fourth embodiment, the planarization is carried out by CPM until the upper surface of the interlayer insulating film 411 so that the upper surface of the silicon film of the elevated source and drain regions 409 and 410 is not exposed. Accordingly, only the upper surfaces of the first metal silicide 413 and the interlayer insulating film 411 are exposed.

Figure 5C:
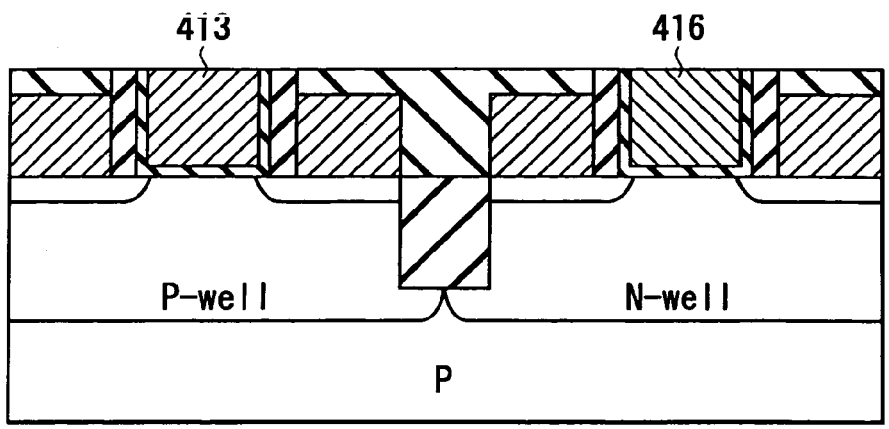

As shown in FIG. 5C, similarly to FIG. 1H in the first embodiment, a solid phase reaction is generated to form a second metal silicide film 416 in such a manner that a first metal film made of the platinum film is formed only on the gate electrode of the P-channel MISFET, i.e. the first metal silicide film 413. Accordingly, a dual metal gate electrode is provided.

Figure 5D:
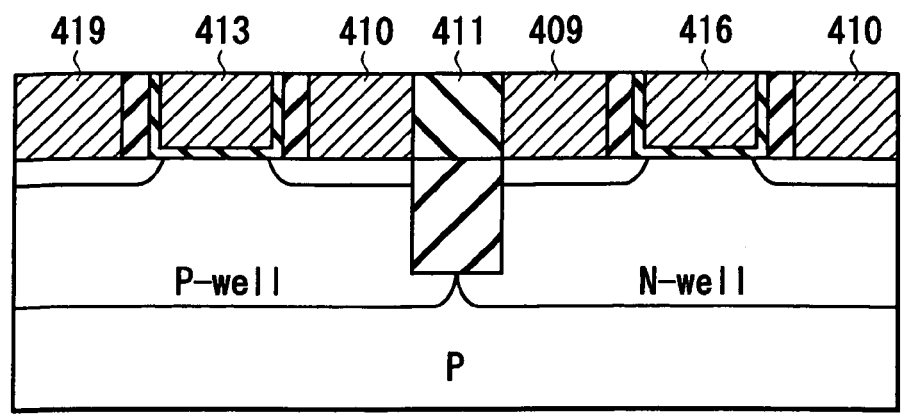

As shown in FIG. 5D, the substrate surface is planarized by CMP until the upper surfaces of the silicon films of the elevated source and drain regions 409 and 410 are exposed.

Figure 5E:
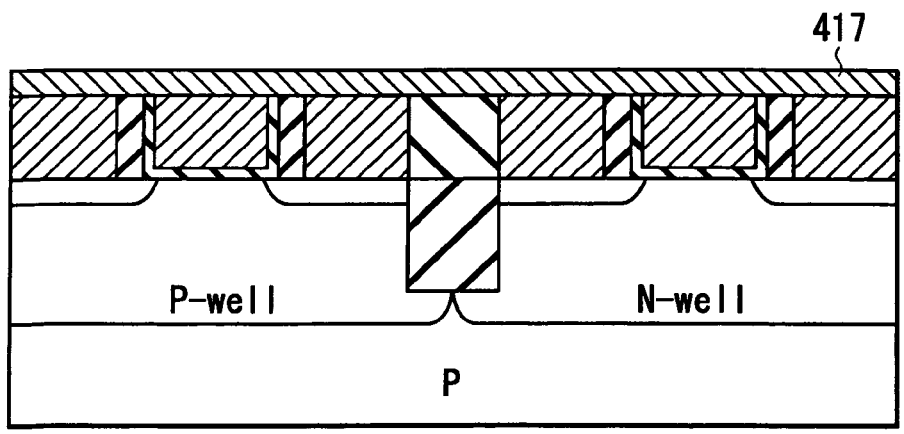

As shown in FIG. 5E, the heat treatment is carried out after a nickel film 417 is deposited over the surface by the sputtering. Consequently, silicon of the elevated source and drain regions 409 and 410, silicon in the gate electrode, which includes the first metal silicide film 413, of the N-channel MISFET, and silicon in the gate electrode, which includes the second metal silicide film 416, of the P-channel MISFET react with nickel in the nickel film 417 to be changed to the nickel silicide film.

Figure 5F:
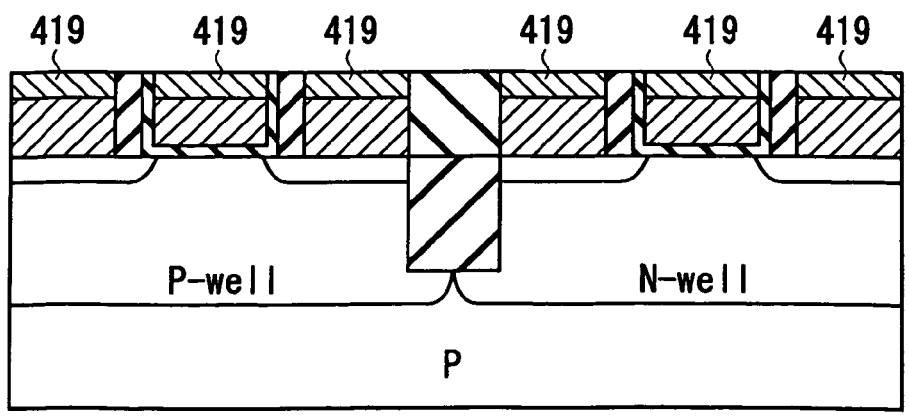

As shown in FIG. 5F, the remaining nickel film 417 is selectively removed with the chemicals, and a nickel silicide film 419 is formed on the upper surfaces of the elevated source and drain regions 409 and 410, the gate electrode, which includes the first metal silicide film 413, of the N-channel MISFET, and the gate electrode, which includes the second metal silicide film 416, of the P-channel MISFET.

Then, the interlayer insulating film (not shown), such as SiO$_2$, is deposited over the silicon substrate 401. Contact holes are made in the interlayer insulating film, and a metal wiring layer made of the material such as Al and Cu is formed on the gate electrode of the N-channel MISFET, the gate electrode of the P-channel MISFET, and the nickel silicide film 419 formed on each upper surface of the elevated source and drain regions 409 and 410, respectively. Further, after the multilayer wiring structure is optionally formed by repeating the deposition of the interlayer insulating film and the formation of the metal wiring layers, the whole surface of the silicon substrate 401 is covered with a surface protective film, and pad portions are opened to complete the semiconductor device including MISFETs.

According to the fourth embodiment, in the P-channel MISFET, a gate electrode made of a material different from that of the gate electrode of the N-channel MISFET can be formed without exposing the surface of the gate insulating film to the etching gas or the chemicals. Accordingly, the semiconductor device including MISFETs each having the gate structure, in which both gate electrodes of the N-channel MISFET and the P-channel MISFET have the proper work functions, the threshold voltage is easily controlled, and reliability of the gate insulating film is excellent, and the method of manufacturing the same can be obtained.

As described above, since the different metal silicide films are used for each gate electrode of the N-channel MISFET and the P-channel MISFET, the semiconductor device including MISFETs each having the gate structure, in which both gate electrodes of the N-channel MISFET and the P-channel MISFET have the proper work functions, the threshold voltage is easily controlled, and reliability of the gate insulating film is excellent, can be obtained.

Further, after the gate electrode of P-channel MISFET is formed by the first metal silicide film, the metal film which is the constituent material of the second metal silicide made of the metal different from one constituting the first metal silicide is formed on the first metal silicide film without removing the first metal silicide film, and the heat treatment is carried out to generate the solid phase reaction between them, thereby providing at least one kind of the layer selected from the second metal silicide and the third metal silicide which is composed of the same constituent material of the first metal silicide and whose silicon content is lower than that of the first metal silicide. Therefore, the gate electrode of the P-channel MISFET having the work function larger than that of the gate electrode of the N-channel MISFET can be formed without resulting in degradation of the gate insulating film of the P-channel MISFET.

The structure capable of coping with further miniaturization of MISFET can be formed by forming the metal silicide electrode in the elevated source and drain regions of the N-channel MISFET and the P-channel MISFET. Further, the silicide electrode layer can be formed in the source and drain regions after the heat treatment process of the relatively high temperature, which forms the gate electrode structure including the gate insulating film and the gate electrode film. Compared with cobalt, titanium, and the like, nickel is preferable because it reacts with silicon at lower temperature to form silicide. In addition, nickel silicide is the excellent material for high-speed operation of the element because nickel silicide has relatively low resistance.

The invention is not limited to the above-described embodiments, other semiconductor substrates or the substrate having an SOI structure may be used as the substrate material, and SiO$_2$, SiO$_x$N$_y$, SiN$_x$, metal oxide, metal silicate, and the combination of these materials may be used as the gate insulating film instead of the hafnium oxide film. Further, other insulating films, metal silicides, doping impurities, and the like may be changed, and various modifications can be implemented within the scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming an isolation region in a semiconductor substrate to provide an N- and a P-channel MISFET regions each surrounded by the isolation region;

forming an insulating film on the semiconductor substrate;

forming a conductive film on the insulating film;

patterning selectively the conductive film to provide a gate region in each of the MISFET regions;

forming source and drain regions in each of the MISFET regions for the patterned conductive film by a self-alignment way;

forming a sidewall insulating film around the patterned conductive film;

removing the conductive film and the insulating film of the gate region to provide a space region surrounded by the sidewall insulating film;

forming a gate insulating film on the N- and P-channel MISFET regions each surrounded by the space region, respectively;

forming a first metal silicide film on the gate insulating film within the space region to provide a first gate electrode film;

forming a metal film different from metal composing the first metal silicide film on the P-channel MISFET region; and heat-treating the semiconductor substrate to form a second gate electrode film formed by a solid phase reaction between the first metal silicide film and the metal film, the second gate electrode film being composed of a second metal silicide made of a second metal material different from a first metal material composing the first metal silicide.

2. The method according to claim 1, wherein the second gate electrode film is formed by changing into a film including at least one material selected from the first metal material and a third metal silicide, the third metal silicide having the same constituent material of the first metal silicide and lower silicon content than the first metal silicide.

3. The method according to claim 1, wherein the number of silicon atoms per unit volume is 2.5 times more than the number of metal atoms per unit volume in a composition ratio between silicon and metal composing the first metal silicide.

4. The method according to claim 1, wherein the number of silicon atoms per unit volume is not more than the number of metal atoms per unit volume in the composition ratio between silicon and metal composing the third metal silicide.

5. The method according to claim 1, wherein a tungsten silicide film is formed as the first metal silicide.

6. The method according to claim 1, wherein the second metal silicide is composed of at least one kind of metal silicide selected from the metal suicides of platinum, palladium, and rhodium.

7. The method according to claim 1, wherein one material selected from the metal film and the metal silicide film is formed on the source and drain regions of the N- and P-channel MISFETs during a process for forming the sidewall insulating film and the space region.

8. The method according to claim 1, wherein a process for forming one material selected from the metal film and the metal silicide film on the source and drain regions of the N- and P-channel MISFETs is carried out after the heat treatment.

* * * * *